United States Patent
Kotzamanis

[19]

[11] Patent Number: 6,100,757
[45] Date of Patent: Aug. 8, 2000

[54] VARIABLE TIME DELAY NETWORK METHOD AND APPARATUS THEROF

[75] Inventor: George Kotzamanis, Schaumburg, Ill.

[73] Assignee: Motorola, Inc., Schaumburg, Ill.

[21] Appl. No.: 09/163,665

[22] Filed: Sep. 30, 1998

[51] Int. Cl.$^7$ ...................................................... H03F 1/00
[52] U.S. Cl. ............................................ 330/151; 330/149
[58] Field of Search ..................................... 333/139, 164, 333/174; 334/15; 330/280, 151, 149

[56] References Cited

U.S. PATENT DOCUMENTS

| | | | |
|---|---|---|---|
| 4,472,725 | 9/1984 | Blumenkranz | 330/149 |
| 4,581,595 | 4/1986 | Silagi | 333/139 |
| 4,885,551 | 12/1989 | Myer . | |
| 5,023,565 | 6/1991 | Lieu . | |
| 5,077,532 | 12/1991 | Obermann et al. . | |
| 5,083,100 | 1/1992 | Hawkins et al. . | |
| 5,376,907 | 12/1994 | Duflot et al. | 333/174 |
| 5,489,875 | 2/1996 | Cavers . | |
| 5,561,398 | 10/1996 | Rasmussen . | |

*Primary Examiner*—Robert Pascal
*Assistant Examiner*—Henry Choe
*Attorney, Agent, or Firm*—Kenneth A. Haas

[57] ABSTRACT

A variable time delay network (210) includes segments (270, 260) which are connected in parallel to form variable time delay network (210). Segment (270) includes a varactor diode (222) and an inductive element (223) connected in series at an anode electrode (290) of varactor (222). A cathode electrode (291) of varactor diode (222) connected to a node (220). Segment (260) includes a varactor (221) and a bypass capacitor (224) connected in series at a cathode electrode (292) of varactor (221). Cathode electrode (292) is connected at a node (225). An anode electrode (293) of varactor (221) connected to node (220). The impedance at node (220) presented to a signal that is to be time delayed remains constant at the center frequency of the signal via a bias voltage applied at node (225) while controlling and changing the time delay of the signal via a bias voltage applied at node (220).

3 Claims, 4 Drawing Sheets

VARIABLE TIME DELAY NETWORK METHOD AND APPARATUS THEROF

FIELD OF THE INVENTION

The present invention relates to an apparatus of variable time delay network and a method for controlling the variable time delay network for time delaying a signal, and more particularly, time delaying a signal in a linear power amplifier.

BACKGROUND OF THE INVENTION

The need to create and control time delay in a signal arises in many different applications. One such an application is in a linear power amplifier (LPA). In a typical LPA, a distortion signal is time delayed before being combined with a composite signal. The distortion signal and the composite signal are combined to cancel the distortion component from the composite signal; as a result, a signal that is essentially free of distortion is produced. Creating accurate and precise time delay in the distortion signal is essential for efficient cancellation of the distortion component from the composite signal.

Referring to FIG. 1, a simplified block diagram of an LPA 100 is shown. LPA 100 receives at an input 121 a signal 101 to be amplified. A splitter 102 splits signal 101 into two essentially identical signals 103 and 104 at outputs 132 and 133 respectively. Signal 103 is coupled to an input 122 of an amplifier 105. A composite signal 107 outputs at an output 124 of amplifier 105. Composite signal 107 essentially composed of signal 103 at an amplified level and distortion signal produced by amplifier 105. Signal 104 is coupled to an input 123 of a time delay block 106. Time delay block 106 time delays signal 104 and produces a time delayed signal 108 at an output 125.

A distortion cancellation loop 190 in LPA 100 cancels the distortion signal of composite signal 107 before outputting an amplified signal 118 at an output 191. Amplified signal 118 is an amplified version of signal 101 but essentially free of distortion. There may be more than one distortion cancellation loop in LPA 100, however, for simplicity of explanation, only one is shown. A portion of composite signal 107 is coupled via coupler 109 as signal 140. Signal 140 passes via a connection 120 to a coupler 110 to be coupled with time delayed signal 108. The amount of time delay in time delay block 106 is proportional to an amount of time delay which signal 103 experiences by propagating through amplifier 105 and coupler 109 before reaching coupler 110. The coupling effect of signals 108 and 140 is that components of signal 103 present in signal 140 are essentially canceled. Signal 140 essentially has all the components of signal 107. As a result, when signal 108 couples with signal 140, a distortion signal 112 is produced which is essentially composed of the distortion signal present in composite signal 107.

Distortion signal 112 passes to an input 127 of an amplifier 114 to produce amplified distortion signal 116 at an output 128. Amplifier 114 amplifies signal 112 without essentially adding to distortion level of signal 112. Amplifier 114 in addition to amplifying signal 112 adjusts the phase of signal 112 and time delays signal 112 before producing signal 116. After composite signal 107 passes through coupler 109, it inputs as signal 111 at an input 126 of a time delay block 113. Time delay block 113 time delays signal 111 essentially equal to time delay that signal 112 experiences by propagating through amplifier 114, and produces signal 115 at output 131. Signals 115 and 116 are combined in combiner 117 to produce signal 118. Since signal 116 composed essentially of distortion signal in signal 115, combining them in combiner 117 essentially cancels the distortion signal from signal 115 and produces signal 118. Signal 118 is as a result free of distortion. Time delay block 106 may include other functions, not shown, such as signal amplitude and phase adjustments; therefore, time delay block 106 may be referred to as an equalization block incorporating time delay, phase and amplitude adjustments.

The cancellation of distortion components from signal 115 in combiner 117 is very critical for operation of LPA 100. Although other time delays are performed in LPA 100, the time delay performed in amplifier 114 is probably the most critical. The time delay and phase change occurring in amplifier 114 should be done with precision. Time delay of signal in amplifier 114 may be performed by adjusting electrical length of a coaxial cable used for propagating the signal. Use of coaxial cable for adjusting time delay has at least two negative consequences. The first consequence is effect of temperature and age on the actual time delay. This problem may only be corrected by periodic inspections and field adjustments of the amplifier long after it has been installed in the filed. Field maintenance may become a major problem. The second consequence is that a change of electrical length of the coaxial cable for adjusting the time delay also effects the signal phase. Therefore, at least an additional phase adjustment of the signal is needed with any change in the electrical length of the coaxial cable.

Therefore, there is a need for an efficient apparatus of variable time delay network and method for controlling the variable time delay network for time delaying a signal without requiring a periodic field inspection, and which additionally does not effect phase of the signal.

DETAILED DESCRIPTION OF THE PREFERRED EMBODIMENT(S)

A variable time delay network according to an embodiment of the invention provides for control of time delay of a signal without affecting the signal phase at the center frequency of the signal. The variable time delay network includes a first segment and a second segment. The first and second segments are connected in parallel to form the variable time delay network. The first segment includes a first varactor diode and an inductive element connected in series at an anode electrode of the first varactor. A cathode electrode of the first varactor diode connected to a first node. The second segment includes a second varactor and a bypass capacitor connected in series at a cathode electrode of the second varactor. The cathode electrode of the second varactor is connected at a second node. An anode electrode of the second varactor connected to the first node. The variable time delay network is connected in shunt configuration in the signal path to time delay the signal in the most preferred embodiment of the invention. The signal which is to be time delayed inputs at the first node. The first and second nodes are used for applying signals at predetermined voltage levels to control the amount of time delay.

Figure 1:
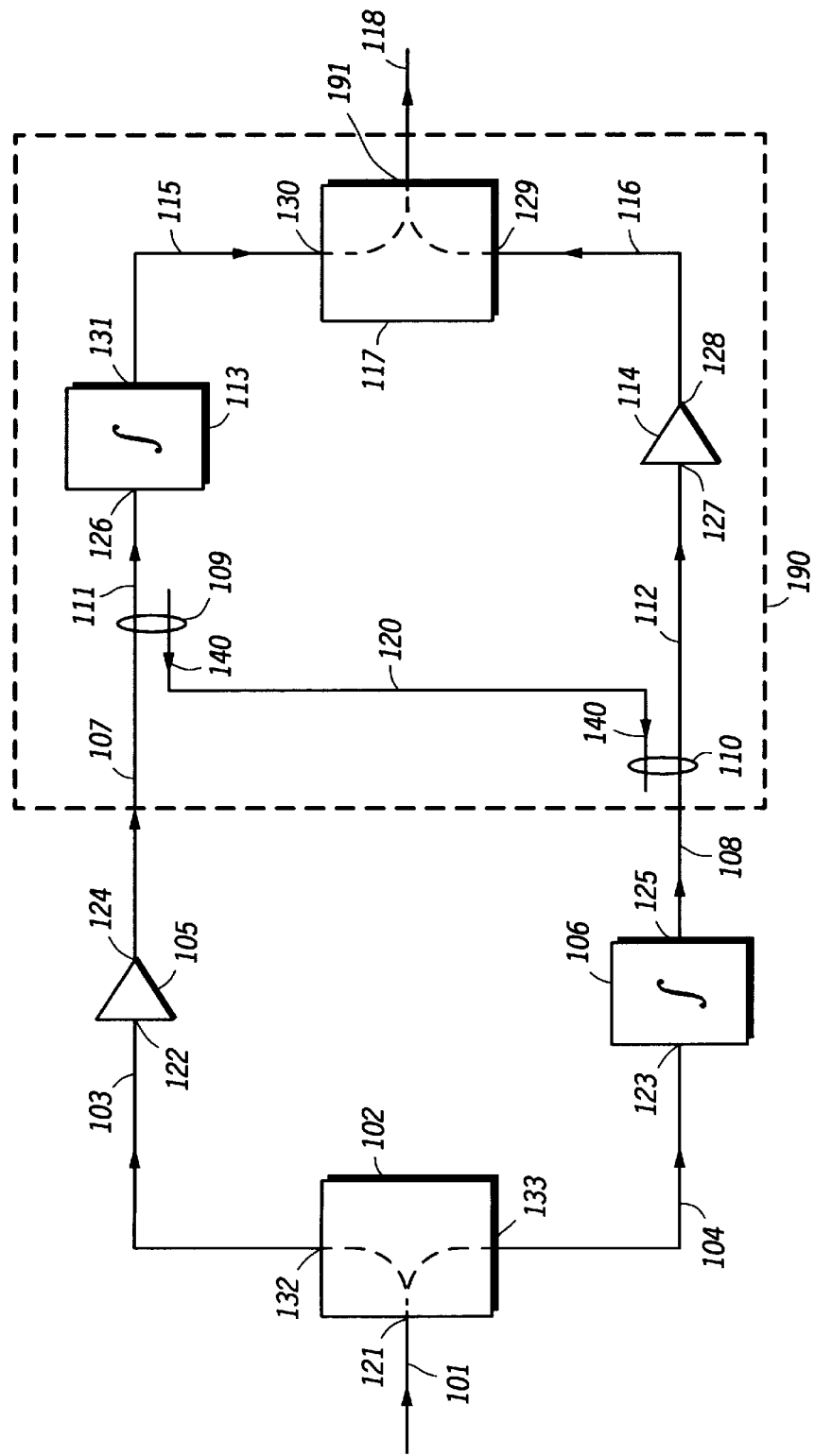
FIG. 1 depicts a block diagram of a linear power amplifier 100.
Figure 2:
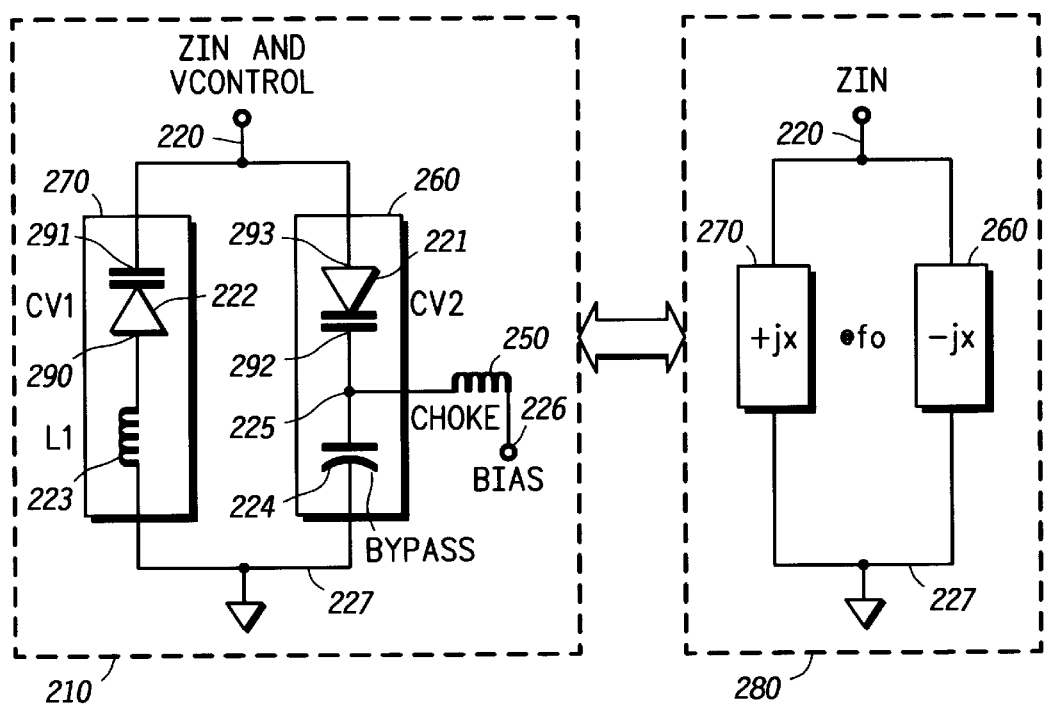
FIG. 2 depicts a variable time delay network according to various embodiments of the invention.

Referring to FIG. 2, a variable time delay network 210 according to various embodiments of the invention is shown. Variable time delay network 210 includes a first segment 270 and a second segment 260. The first and second segments 260 and 270 are connected in parallel to form the variable time delay network. First segment 270 includes a first varactor diode 222 and an inductive element 223, such as an airwound inductor, connected in series at an anode electrode 290 of first varactor 222. A cathode electrode 291 of first varactor diode 222 connected to a first node 220. Second segment 260 includes a second varactor 221 and a bypass capacitor 224 connected in series at a cathode electrode 292 of second varactor 221. Cathode electrode 292 of second varactor 221 is connected at a second node 225. An anode electrode 293 of second varactor 221 connected to first node 220. Variable time delay network 210 is connected in shunt configuration in the signal path to time delay the signal in the most preferred embodiment of the invention. The signal which is to be time delayed inputs at first node 220. The impedance at first node 220 presented to the signal that is to be delayed remains constant at the center frequency of the signal while controlling and changing the time delay of the signal. This is an advantage of the present invention. First and second nodes 220 and 225 are used for applying signals at predetermined voltage levels to control the amount of time delay. To eliminate any undesired effect of radio frequency signal, second node 225 may be isolated from the source of the bias voltage at a node 226 via a choke 250 or similar isolation techniques. First and second segments are connected at a node 227 which may be a ground node.

Referring to FIG. 2, a block 280 represents reactance components of impedance of segments 270 and 260 with respect to each other according to the most preferred embodiment of the invention. Reactance of segments 270 and 260 are adjusted to be equal and in opposite polarity at the center frequency of the signal to be time delayed. A bias voltage applied at node 226 is adjusted to an optimum level to adjust reactance of segments 270 and 260 to an equal and in opposite polarity at the center frequency of the signal to be time delayed.

Figure 3:
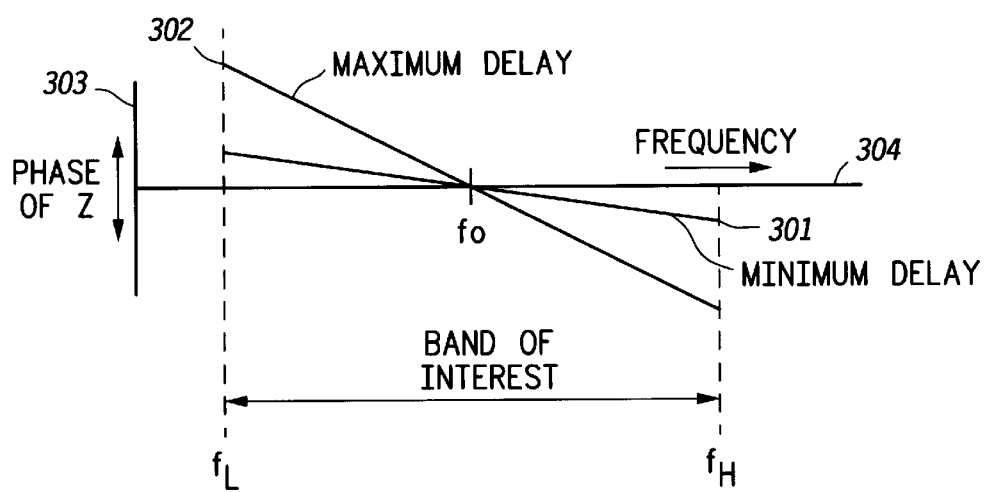
FIG. 3 depicts time delay of a signal with respect to phase of the impedance at a node of the variable time delay network presented to the signal.

Referring to FIG. 3, time delay of the signal with respect to phase 303 of the impedance at node 220 presented to the signal is shown. The frequency of the interest at 304 may be limited to fL and fH. The center frequency is set at fO. Phase 303 is controlled via a control voltage applied at node 220. Theoretically, a change in amount of time delay is equal to a change of phase over a frequency band in radian divided by the frequency band in radian per second. The frequency band is equal to fH minus fL. When reactance components of impedance of segments 270 and 260 with respect to each other are set via bias voltage at node 226 to be approximately equal and in opposite polarity, phase 303 pivots around the center frequency fO when the control voltage applied via node 220 is changed from one level to another level. The change in level of the control voltage at node 220 determines the time delay of the signal from one level to another level. Since the phase at center frequency remains constant at different control voltage levels, the time delay is conveniently controlled with precision via the control voltage applied via node 220. For example, phase change from fL to fH at two different voltage levels are shown at 301 and 302.

Figure 4:
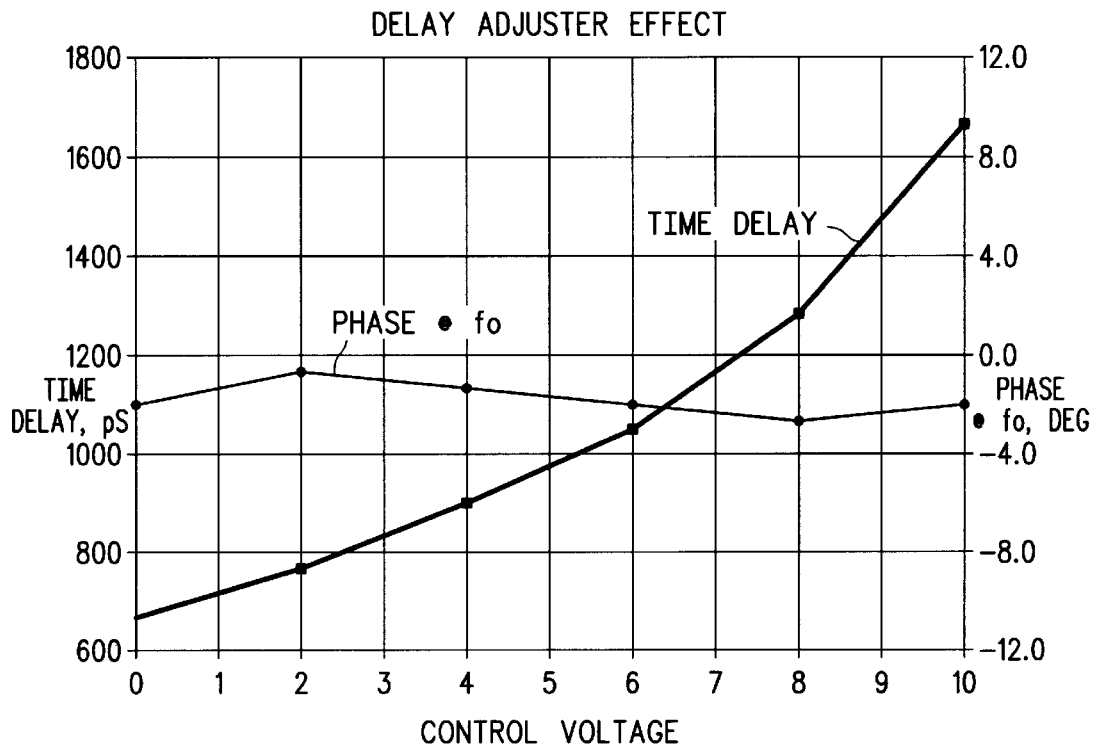
FIG. 4 depicts a plot of time delay of a signal verses the control voltage at the variable time delay network.

Referring to FIG. 4, a plot of time delay of a signal verses the control voltage at node 220 is shown. The horizontal axis shows the control voltage level, and the vertical axis on the left hand side shows the amount of time delay in pico seconds, and the vertical axis on the right shows the phase of the network 210 as presented at the center frequency of the signal to be delayed at node 220. The phase remains substantially constant within 2 degrees for a time delay change of approximately 1000 pico seconds.

Figure 5:
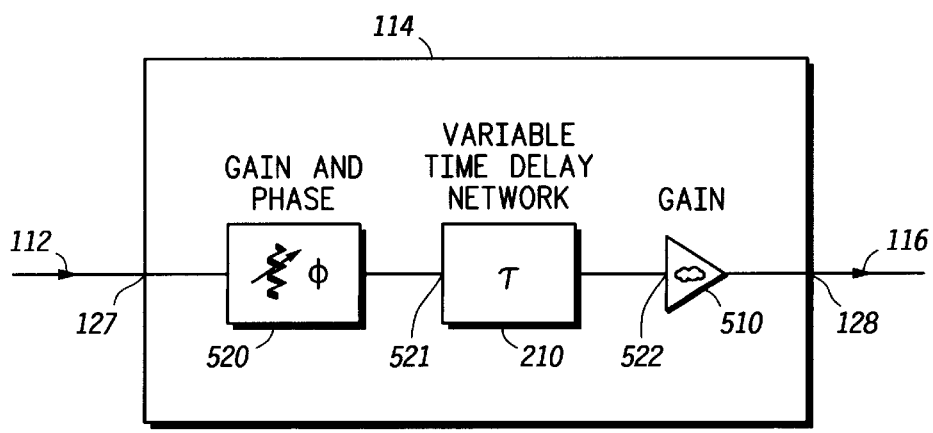
FIG. 5 depicts an amplifier that is utilizing the variable time delay network.

Referring to FIG. 5, a simplified block diagram of amplifier 114 utilizing variable time delay network 210 is shown. Variable time delay network 210 may be used in many different applications and circuit configurations. For example, variable time delay network 210 may be used in substitute of delay blocks 113 and 106, or time delay functions of blocks 113 and 106 if blocks 113 and 106 incorporate other functions such as amplitude and phase adjustments. In practice, delay blocks 113 and 106 do not require to perform time delay adjustments as precise as the time delay adjustment needed in amplifier 114. Therefore, the most preferred embodiment of the invention is in amplifier 114 which amplifies distortion signal 112 to produce amplified distortion signal 116. Amplifier 114 may include a gain and phase adjuster 520 to adjust the gain and phase of signal 112. Next, variable time delay network 210 at an input 521 receives the output of phase adjuster 520. After adjusting time delay of the signal, at output 522, the time delayed signal is fed to a gain block 510. The received signal at this point is amplified to an appropriate level to produce signal 116. Design of amplifier 114 is very flexible. A designer may choose an arrangement of gain and phase adjuster 520, variable time delay network 210, and gain block 510 that is different than what is depicted in FIG. 5. Variable time delay network 210 may be implemented and used in a variety of ways.

Figure 6:
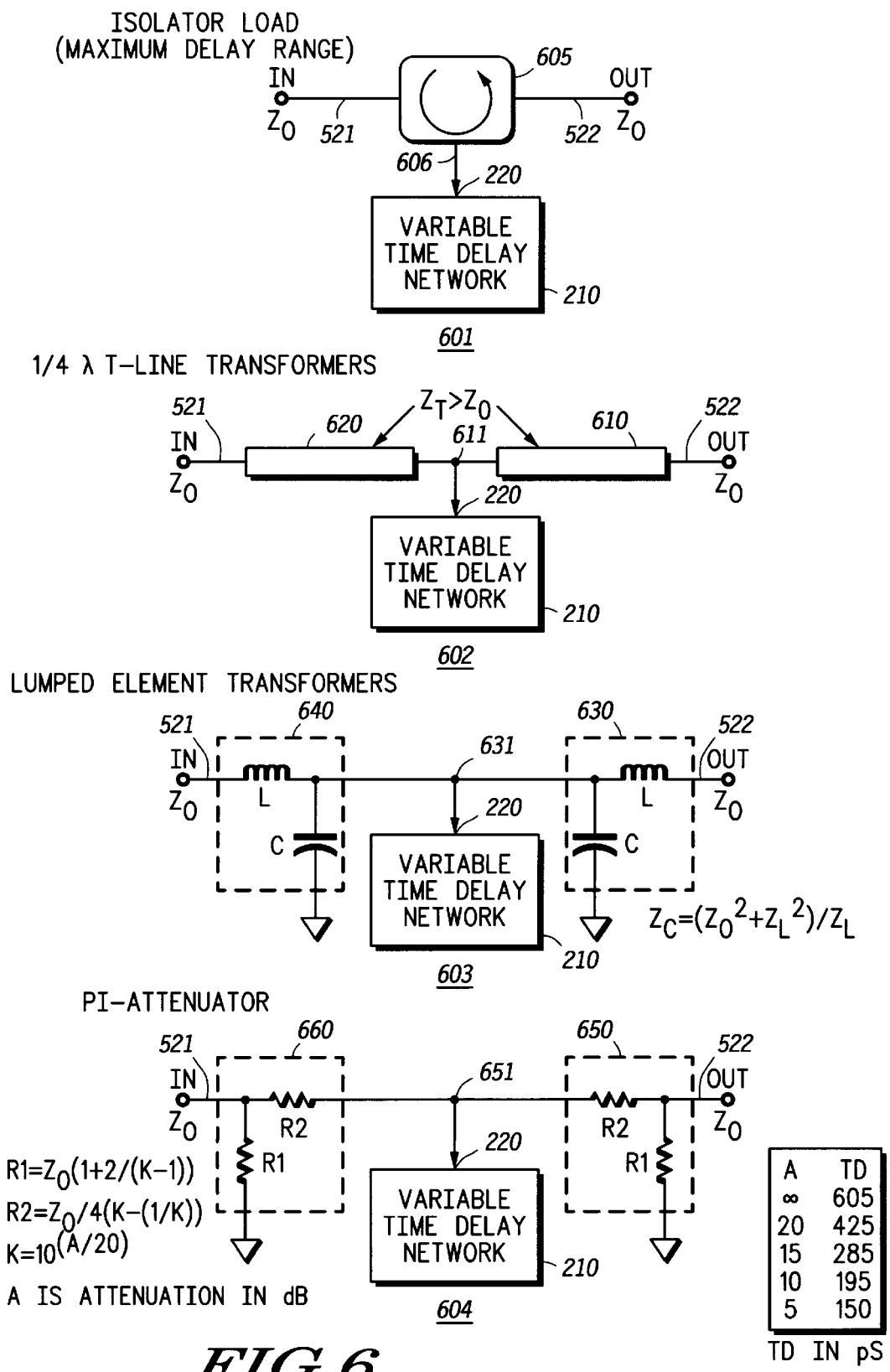
FIG. 6 depicts four ways of implementing the variable time delay network.

Referring to FIG. 6, four ways of implementing variable time delay network 210 are shown. A first method 601 includes an isolator 605 connected between input 521 and output 522 with first node 220 connected at an isolated port 606 of the isolator 605. A second method 602 involves one-quarter-T-Line transformers 610 and 620. Transformers 610 and 620 are connected between input 521 and output 522 with first node 220 connected at a common node 611. A third method 603 involves lumped elements transformers 630 and 640. Transformers 630 and 640 are connected between input 521 and output 522 with first node 220 connected at a common node 631. A forth method 604 involves pi-attenuator elements 650 and 660. Pi-attenuator elements 650 and 660 are connected between input 521 and output 522 with first node 220 connected at a common node 651.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What is claimed is:

1. A method of controlling time delay of a signal, comprising:

applying a first bias voltage at a first node of a variable time delay network to control time delay of said signal when passing through said variable time delay network, said variable time delay network including:

a first segment and a second segment, said first and second segments connected in parallel to form said variable time delay network, said first segment including:

a first varactor diode and an inductive element connected in series at an anode electrode of said first varactor, a cathode electrode of said first varactor diode connected to said first node;

and said second segment including:

a second varactor and a bypass capacitor connected in series at a cathode electrode of said second varactor, said cathode electrode of said second varactor connected at a second node, an anode electrode of said second varactor connected to said first node;

applying a second bias voltage at said second to node to create in said first and second segments an approximately equal and opposite polarity reactance while applying said first bias voltage at said first node of said variable time delay network.

2. The method as recited in claim 1 wherein said signal is a distortion signal in a distortion cancellation loop of a linear power amplifier.

3. A linear power amplifier for amplifying a signal, comprising:

an amplifying loop producing a composite and a distortion signal, said composite signal including essentially said signal at an amplified level and essentially said distortion signal;

a distortion cancellation loop including a variable time delay network for adjusting time delay of said distortion signal, said variable time delay network including:

a first segment and a second segment, said first and second segments connected in parallel to form said variable time delay network, said first segment including:

a first varactor diode and an inductive element connected in series at an anode electrode of said first varactor, a cathode electrode of said first varactor diode connected to said first node;

and said second segment including:

a second varactor and a bypass capacitor connected in series at a cathode electrode of said second varactor, said cathode electrode of said second varactor connected at a second node, and an anode electrode of said second varactor connected to said first node;

a combiner for combining a time delayed version of said distortion signal and said composite signal to cancel approximately said distortion signal of said composite signal and to produce an amplified signal essentially free of said distortion signal.

* * * * *